(12) United States Patent
Kwon et al.

(10) Patent No.: US 11,720,196 B2
(45) Date of Patent: Aug. 8, 2023

(54) DISPLAY DEVICE

(71) Applicant: LG Display Co., Ltd., Seoul (KR)

(72) Inventors: Hyowon Kwon, Suwon-si (KR);
Jaekyung Choi, Goyang-si (KR);
MoonBae Gee, Paju-si (KR); Haewon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/973,455

(22) Filed: Oct. 25, 2022

(65) Prior Publication Data
US 2023/0214034 A1 Jul. 6, 2023

(30) Foreign Application Priority Data
Dec. 31, 2021 (KR) .................. 10-2021-0194061

(51) Int. Cl.
| | |
|---|---|
| *G06F 3/041* | (2006.01) |
| *G06F 3/044* | (2006.01) |
| *H01L 33/62* | (2010.01) |
| *H01L 33/50* | (2010.01) |
| *H01L 25/075* | (2006.01) |

(52) U.S. Cl.
CPC .......... *G06F 3/0412* (2013.01); *G06F 3/0446* (2019.05); *G06F 3/0448* (2019.05); *H01L 25/0753* (2013.01); *H01L 33/505* (2013.01); *H01L 33/62* (2013.01); *G06F 2203/04112* (2013.01)

(58) Field of Classification Search
CPC .... G06F 3/0412; G06F 3/0446; G06F 3/0448; G06F 2203/04112; H01L 25/0753; H01L 33/505; H01L 33/62
See application file for complete search history.

(56) References Cited

U.S. PATENT DOCUMENTS

| | | | | |
|---|---|---|---|---|
| 9,891,775 B2* | 2/2018 | Yoo | ................ | G06F 3/0412 |
| 10,817,093 B2* | 10/2020 | Feng | ................ | H10K 59/40 |
| 11,360,630 B1* | 6/2022 | Li | ................ | G06F 3/0412 |

(Continued)

FOREIGN PATENT DOCUMENTS

KR 20210017145 A 2/2021

*Primary Examiner* — Amit Chatly
(74) *Attorney, Agent, or Firm* — Seed IP Law Group LLP

(57) ABSTRACT

In order to achieve the above-described technical benefits, according to an aspect of the present disclosure, a display device is provided. The display device includes a display panel in which a plurality of pixels is disposed, a touch panel which is disposed on the display panel, and a filling layer is disposed between the display panel and the touch panel. The display panel includes: a stretchable lower substrate; a pattern layer which is disposed on the lower substrate and includes a plurality of plate patterns in which a plurality of pixels is disposed and a plurality of line patterns. Further, the touch panel includes: a stretchable upper substrate; a plurality of color conversion layers and a plurality of light transmission layers which are disposed on the upper substrate and correspond to the plurality of plate patterns; and a touch electrode which is disposed at an edge of respective color conversion layers and a respective light transmission layer corresponding to each of the plurality of pixels among the plurality of color conversion layers and the plurality of light transmission layers.

12 Claims, 9 Drawing Sheets

(56) References Cited

U.S. PATENT DOCUMENTS

| | | | |
|---|---|---|---|
| 2012/0241408 A1* | 9/2012 | Misaki | B32B 27/38 |
| | | | 216/20 |
| 2018/0067589 A1* | 3/2018 | Leng | G02F 1/136286 |
| 2021/0192986 A1* | 6/2021 | Wu | G09F 9/301 |
| 2022/0253169 A1* | 8/2022 | Won | H10K 77/111 |

* cited by examiner

DISPLAY DEVICE

CROSS-REFERENCE TO RELATED APPLICATIONS

This application claims the priority of Korean Patent Application No. 10-2021-0194061 filed on Dec. 31, 2021, in the Korean Intellectual Property Office, the disclosure of which is incorporated herein by reference.

BACKGROUND

Technical Field

The present disclosure relates to a display device, and more particularly, to a display device which includes a touch panel including a color conversion layer.

Description of the Related Art

As display devices which are used for a monitor of a computer, a television, or a cellular phone, there are an organic light emitting display device (OLED) which is a self-emitting device and a liquid crystal display device (LCD) which includes a separate light source.

An applicable range of the display device is diversified to personal digital assistants as well as monitors of computers and televisions and a display device with a large display area and a reduced volume and weight is being studied.

Recently, a display device which is manufactured by forming a display unit and a wiring line on a flexible substrate such as plastic which is a flexible material so as to be stretchable in a specific direction and changed in various forms is getting attention as a next generation display device.

BRIEF SUMMARY

A technical benefit to be achieved by the present disclosure is to provide a display device in which the reduction of a transmittance of an emission area due to a touch panel is minimized or reduced.

Another technical benefit to be achieved by the present disclosure is to provide a display device whose manufacturing process is simplified by omitting a separate manufacturing process of a color conversion panel.

Another technical benefit to be achieved by the present disclosure is to provide a display device in which a plurality of light emitting diodes is easily transferred.

Another technical benefit to be achieved by the present disclosure is to provide a display device in which a light extraction efficiency is improved and a visibility is improved.

Technical benefits of the present disclosure are not limited to the above-mentioned technical benefits, and other technical benefits, which are not mentioned above, can be clearly understood by those skilled in the art from the following descriptions.

In order to achieve the above-described technical benefits, according to an aspect of the present disclosure, a display device is provided. The display device includes a display panel in which a plurality of pixels is disposed, a touch panel which is disposed on the display panel, and a filling layer disposed between the display panel and the touch panel. The display panel includes: a stretchable lower substrate; a pattern layer which is disposed on the lower substrate and includes a plurality of plate patterns in which a plurality of pixels is disposed and a plurality of line patterns. Further, the touch panel includes: a stretchable upper substrate; a plurality of color conversion layers and a plurality of light transmission layers which are disposed on the upper substrate and correspond to the plurality of plate patterns; and a touch electrode which is disposed at an edge of respective color conversion layers and a respective light transmission layer corresponding to each of the plurality of pixels among the plurality of color conversion layers and the plurality of light transmission layers.

Other detailed matters of the example embodiments are included in the detailed description and the drawings.

According to the present disclosure, a hole of a touch electrode is disposed so as to correspond to each of the plurality of pixels to minimize or reduce the reduction of the transmittance of the emission area due to the touch electrode.

According to the present disclosure, a color conversion layer and a light transmission layer are disposed between touch electrodes to provide a touch panel including a color conversion layer.

According to the present disclosure, a color conversion layer and a light transmission layer are disposed between the touch electrodes to minimize or reduce the number of times of transferring the light emitting diodes and the number of times of bonding the display device may be minimized or reduced.

According to the present disclosure, a metal layer is disposed between the color conversion layers or the light transmittance layers to improve a light extraction efficiency.

According to the present disclosure, a black matrix is disposed at an inner edge of the hole of the touch electrode so as to correspond to each of the plurality of pixels to improve the visibility.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
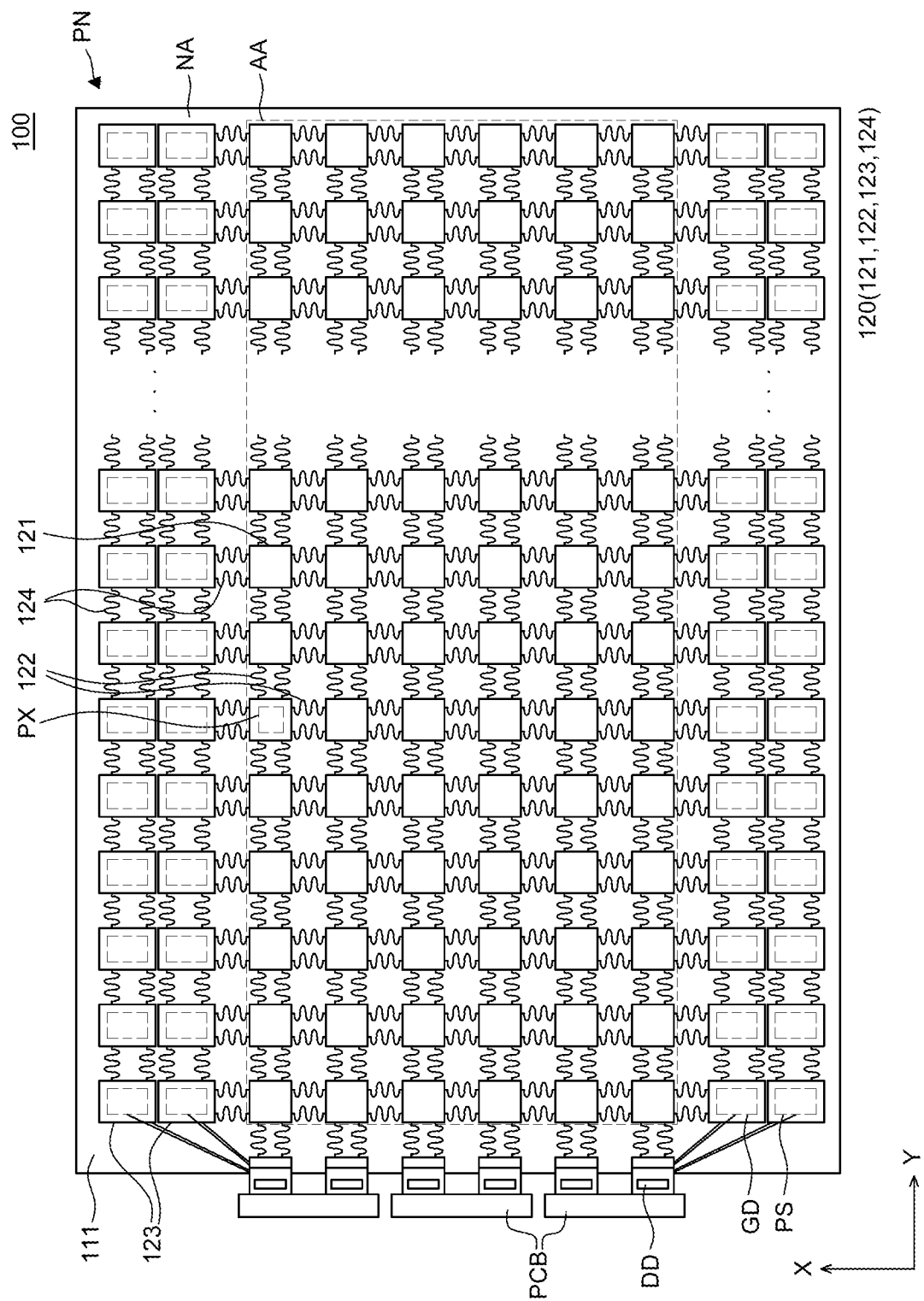
FIG. 1 is a plan view of a display panel of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

A display device according to an example embodiment of the present disclosure is a display device which is capable of displaying images even in a bent or extended state and is also referred to as a stretchable display device, a flexible display device and an extendable display device. As compared with the general display devices of the related art, the display device has not only a high flexibility, but also stretchability. Therefore, the user may bend or extend a display device and a shape of a display device may be freely changed in accordance with manipulation of a user. For example, when the user pulls the display device by holding ends of the display device, the display device may be extended to the pulling direction of the user. Alternatively, when the user disposes the display device on an outer surface which is not flat, the display device may be disposed to be bent in accordance with the shape of the outer surface of the wall. Further, when a force applied by the user is removed, the display device may return to its original shape.

<Stretchable substrate and pattern layer>

FIG. 1 is a plan view of a display panel according to an example embodiment of the present disclosure. Specifically, the display device 100 according to the example embodiment of the present disclosure includes a display panel PN, a data driver DD, a gate driver GD, and a printed circuit board PCB. In the display panel PN, a plurality of data lines and a plurality of gate lines are disposed and a plurality of sub pixels SPX at regions of overlap of the plurality of data lines and the plurality of gate lines is disposed. The data driver DD drives the plurality of data lines and the gate driver GD drives the plurality of gate lines, and the printed circuit board PCB controls operations of the data driver DD and the gate driver GD.

In order to provide a touch sensing function, the display device according to one example embodiment of the present disclosure may include a touch panel TSP including a plurality of touch electrodes 151 and a touch sensing circuit. The touch sensing circuit supplies a touch driving signal to the touch panel TSP and detects a touch sensing signal from the touch panel TSP to sense the presence of a touch of a user or a touch position (touch coordinate) in the touch panel TSP based on the detected touch sensing signal.

Referring to FIG. 1, a display panel PN according to an example embodiment of the present disclosure includes a lower substrate 111, a pattern layer 120, a plurality of pixels PX, a gate driver GD, a data driver DD, and a power supply PS. Further, referring to FIG. 5, the display device 100 according to the example embodiment of the present disclosure may further include a filling layer 190 and an upper substrate 112. It should be understood that "filling" includes within it the meaning of "completing the filling of" and "partially filling" and "completely filling," such that it is not a requirement that the filling layer 190 completely fill the entire volume between two or more structures. Other structures or layers may be located between the filling layer 190 and nearby structures or layers. As such, the filling layer 190 may also be referred to as an intermediate layer 190, as the filling layer 190 is between or intermediate one or more elements of the display panel PN (see FIG. 5, for example).

The lower substrate 111 is a substrate which supports and protects several components of the display device 100. Further, the upper substrate 112 is a substrate which covers and protects several components of the display device 100. That is, the lower substrate 111 is a substrate which supports the pattern layer 120 on which the pixels PX, the gate driver GD, and the power supply PS are formed. Further, the upper substrate 112 is a substrate which covers the pixels PX, the gate driver GD, and the power supply PS.

The lower substrate 111 and the upper substrate 112 which are flexible substrates may be configured by an insulating material which is bendable or extendable. For example, the lower substrate 111 and the upper substrate 112 may be formed of a silicone rubber such as polydimethylsiloxane (PDMS) or an elastomer such as polyurethane (PU) and polytetrafluoroethylene (PTFE) and thus have a flexibility. Further, the materials of the lower substrate 111 and the upper substrate 112 may be the same, but are not limited thereto and may vary.

The lower substrate 111 and the upper substrate 112 are flexible substrates so as to be reversibly expandable and contractible. Accordingly, the lower substrate 111 may be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 may be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a timing when an object to be stretched is broken or cracked. A thickness of the lower substrate may be 10 μm to 1 mm, but is not limited thereto.

The lower substrate 111 may have an active area AA and a non-active area NA which encloses the active area AA. However, the active area AA and the non-active area are not mentioned to be limited to the lower substrate 111, but mentioned for the entire display device 100.

The active area AA is an area in which images are displayed in the display device 100. The plurality of pixels PX is disposed in the active area AA. Further, each pixel PX may include a display element and various driving elements for driving the display element. Various driving elements may refer to at least one thin film transistor (TFT) and a capacitor, but are not limited thereto. Further, the plurality of pixels PX may be connected to various wiring lines, respectively. For example, each of the plurality of pixels PX may be connected to various wiring lines, such as a gate line, a data line, a high potential voltage line, a low potential voltage line, a reference voltage line, and an initialization voltage line.

The non-active area NA is an area where no image is displayed. The non-active area NA is an area adjacent to the active area AA. Further, the non-active area NA is adjacent to the active area AA to enclose the active area AA. However, it is not limited thereto so that the non-active area NA corresponds to an area excluding the active area AA from the lower substrate 111 and may be modified and separated in various forms. Components for driving the plurality of pixels PX disposed in the active area AA are disposed in the non-active area NA. That is, the gate driver GD and the power supply PS may be disposed in the non-active area NA. Further, in the non-active area NA, a plurality of pads electrically connected to the gate driver GD and the data driver DD may be disposed and each pad may be electrically connected to each of the plurality of pixels PX of the active area AA.

A pattern layer 120 including a plurality of first plate patterns 121 and a plurality of first line patterns 122 disposed in the active area AA and a plurality of second plate patterns 123 and a plurality of second line patterns 124 disposed in the non-active area NA is disposed on the lower substrate 111.

The plurality of first plate patterns 121 is disposed in the active area AA of the lower substrate 111 so that the plurality of pixels PX is formed on the plurality of first plate patterns 121. Further, the plurality of second plate patterns 123 may be disposed in the non-active area NA of the lower substrate 111. Further, the gate driver GD and the power supply PS are formed on the plurality of second plate patterns 123.

The plurality of first plate patterns 121 and the plurality of second plate patterns 123 which have been described above are formed in the form of separate islands. The plurality of first plate patterns 121 and the plurality of second plate patterns 123 may be individually separated. Therefore, the plurality of first plate patterns 121 and the plurality of second plate patterns 123 may be referred to as first island patterns and second island patterns or first individual patterns and second individual patterns.

Specifically, the gate driver GD may be mounted in the plurality of second plate patterns 123. The gate driver GD may be formed on the second plate pattern 123 in a gate in panel (GIP) manner when various elements on the first plate pattern 121 are manufactured. Therefore, various circuit configurations which configure the gate driver GD, such as various transistors, capacitors, and wiring lines, may be disposed on the plurality of second plate patterns 123. However, it is not limited thereto and the gate driver GD may be mounted in a chip on film (COF) manner.

Further, the power supply PS may be mounted in the plurality of second plate patterns 123. The power supply PS is a plurality of power blocks patterned when various components on the first plate pattern 121 is manufactured and may be formed on the second plate pattern 123. Therefore, power blocks disposed on different layers may be disposed on the second plate pattern 123. Accordingly, a lower power block and an upper power block may be sequentially disposed on the second plate pattern 123. Further, a low potential voltage may be applied to the lower power block and a high potential voltage may be applied to the upper power block. Therefore, the low potential voltage may be supplied to the plurality of pixels PX by means of the lower power block. Further, the high potential voltage may be supplied to the plurality of pixels PX by means of the upper power block.

Referring to FIG. 1, sizes of the plurality of second plate patterns 123 may be larger than sizes of the plurality of first plate patterns 121. Specifically, a size of each of the plurality of second plate patterns 123 may be larger than a size of each of the plurality of first plate patterns 121. As described above, the gate driver GD is disposed on each of the plurality of second plate patterns 123 and one stage of the gate driver GD is disposed in each of the plurality of second plate patterns 123. Therefore, an area occupied by various circuit configurations which configure one stage of the gate driver GD may be relatively larger than an area occupied by the pixel PX so that a size of each of the plurality of second plate patterns 123 may be larger than a size of each of the plurality of first plate patterns 121.

Even though in FIG. 1, the plurality of second plate patterns 123 is disposed on both sides of the non-active area NA in the first direction X, it is not limited thereto and may be disposed in an arbitrary area of the non-active area NA. Further, even though it is illustrated that the plurality of first plate patterns 121 and the plurality of second plate patterns 123 have a square shape, it is not limited thereto and the shapes of the plurality of first plate patterns 121 and the plurality of second plate patterns 123 may vary in various forms.

Figure 3:
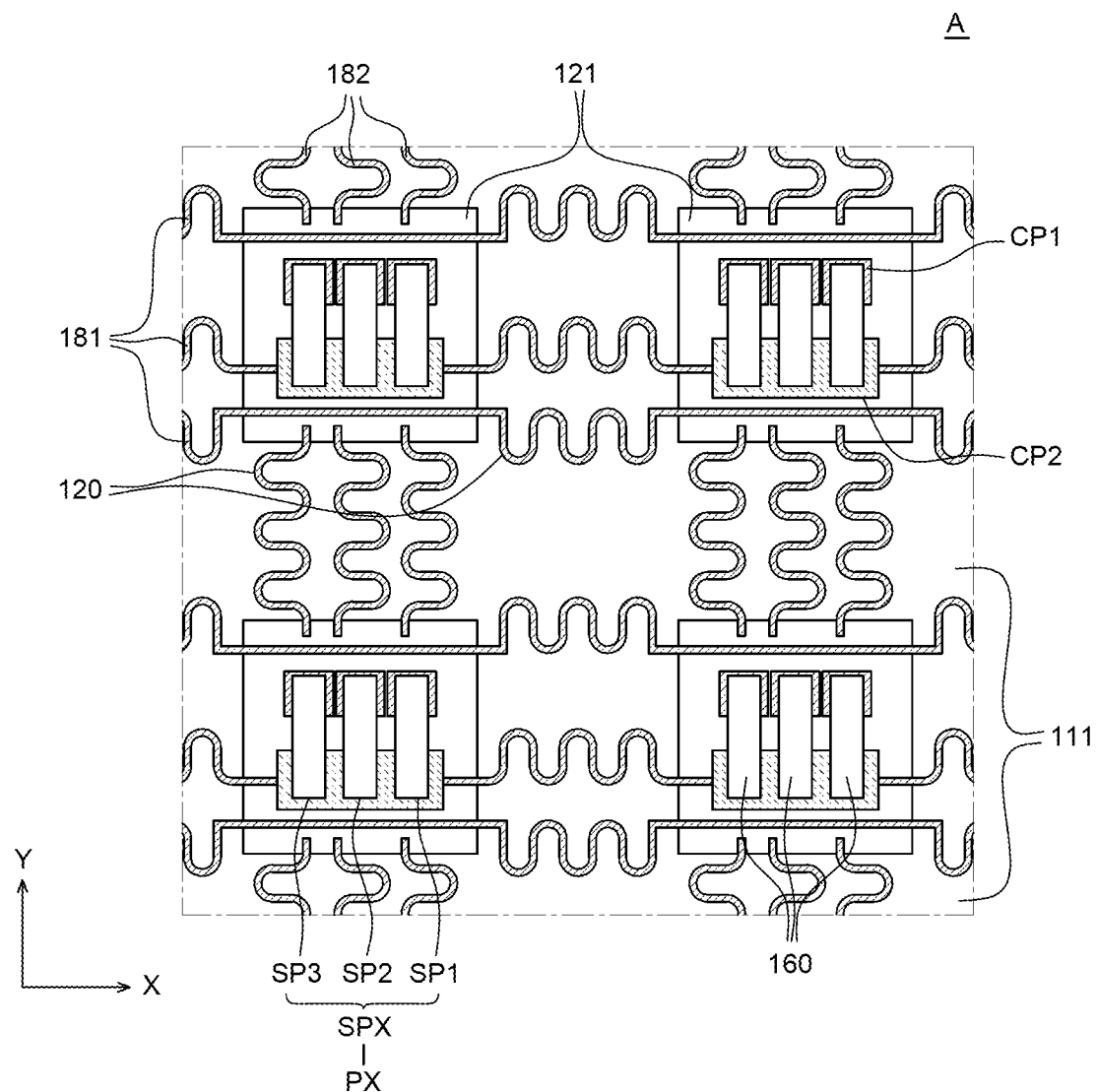
FIG. 3 is an enlarged plan view of an active area of a display panel according to an example embodiment of the present disclosure.

Referring to FIGS. 1 and 3, the pattern layer 120 may further include a plurality of first line patterns 122 disposed in the active area AA and a plurality of second line patterns 124 disposed in the non-active area NA.

The plurality of first line patterns 122 is patterns which are disposed in the active area AA and connect the first plate patterns 121 which are adjacent to each other and is referred to as first connection patterns. That is, the plurality of first line patterns 122 is disposed between the plurality of first plate patterns 121.

The plurality of second line patterns 124 is patterns which are disposed in the non-active area NA and connect the first plate patterns 121 and the second plate patterns 123 which are adjacent to each other or connect a plurality of second plate patterns 123 which is adjacent to each other. Accordingly, the plurality of second line patterns 124 may be referred to as second connection patterns. Further, the plurality of second line patterns 124 may be disposed between the first plate pattern 121 and the second plate pattern 123 which are adjacent to each other and between the plurality of second plate patterns 123 which is adjacent to each other.

Referring to FIG. 1, the plurality of first line patterns 122 and the plurality of second line patterns 124 have a wavy shape. For example, the plurality of first line patterns 122 and the plurality of second line patterns 124 have a sinusoidal shape. However, the shape of the plurality of first line patterns 122 and the plurality of second line patterns 124 is not limited thereto. For example, the plurality of first line patterns 122 and the plurality of second line patterns 124 may extend in a zigzag pattern. Further, the plurality of first line patterns 122 and the plurality of second line patterns 124 may have various shapes such as a plurality of rhombic substrates which is connected at their vertexes to be extended. Further, the number and the shape of the plurality of first line patterns 122 and the plurality of second line patterns 124 illustrated in FIG. 1 are examples and may be changed in various forms depending on the design.

Further, the plurality of first plate patterns 121, the plurality of first line patterns 122, the plurality of second plate patterns 123, and the plurality of second line patterns 124 are rigid patterns. That is, the plurality of first plate patterns 121, the plurality of first line patterns 122, the plurality of second plate patterns 123, and the plurality of second line patterns 124 may be rigider than the lower substrate 111 and the upper substrate 112. Accordingly, moduli of elasticity of the plurality of first plate patterns 121, the plurality of first line patterns 122, the plurality of second plate patterns 123, and the plurality of second line patterns 124 may be higher than a modulus of elasticity of the lower substrate 111. The modulus of elasticity is a parameter representing a rate of deformation against the stress applied to the substrate and the higher the modulus of elasticity, the higher the hardness. Therefore, the plurality of first plate patterns 121, the plurality of first line patterns 122, the plurality of second plate patterns 123, and the plurality of second line patterns 124 may be referred to as a plurality of first rigid patterns, a plurality of second rigid patterns, a plurality of third rigid patterns, and a plurality of fourth rigid patterns, respectively. Moduli of elasticity of the plurality of first plate patterns 121, the plurality of first line patterns 122, the plurality of second plate patterns 123, and the plurality of second line patterns 124 may be 1000 times or higher than the moduli of elasticity of the lower substrate 111 and the upper substrate 112, but it is not limited thereto.

The plurality of first plate patterns 121, the plurality of first line patterns 122, the plurality of second plate patterns 123, and the plurality of second line patterns 124 which are a plurality of rigid patterns may be formed of a plastic material having a lower flexibility than the lower substrate 111 and the upper substrate 112. For example, the plurality of first plate patterns 121, the plurality of first line patterns 122, the plurality of second plate patterns 123, and the plurality of second line patterns 124 are formed of polyimide (PI), polyacrylate, polyacetate, and the like. At this time, the plurality of first plate patterns 121, the plurality of first line patterns 122, the plurality of second plate patterns 123, and the plurality of second line patterns 124 may be formed of the same material, but is not limited thereto and may be formed of different materials. When the plurality of first plate patterns 121, the plurality of first line patterns 122, the plurality of second plate patterns 123, and the plurality of second line patterns 124 are formed of the same material, the patterns may be integrally formed.

In some example embodiments, the lower substrate 111 may include a plurality of first lower patterns and a second lower pattern. The plurality of first lower patterns may be an area of the lower substrate 111 overlapping the plurality of first plate patterns 121 and the plurality of second plate patterns 123. The second lower pattern may be an area which does not overlap the plurality of first plate patterns 121 and the plurality of second plate patterns 123.

Further, the upper substrate 112 may include a plurality of first upper patterns and a second upper pattern. The plurality of first upper patterns may be an area overlapping the plurality of the first plate patterns 121 and the plurality of second plate patterns 123 of the upper substrate 112, but the second upper pattern may be an area which does not overlap the plurality of the first plate patterns 121 and the plurality of second plate patterns 123.

At this time, moduli of elasticity of the plurality of first lower patterns and the first upper pattern may be higher than moduli of elasticity of the second lower pattern and the second upper pattern. For example, the plurality of first lower patterns and the first upper pattern may be formed of the same material as the plurality of first plate patterns 121 and the plurality of second plate patterns 123. The second lower pattern and the second upper pattern may be formed of a material having a modulus of elasticity lower than those of the plurality of first plate patterns 121 and the plurality of second plate patterns 123.

That is, the first lower pattern and the first upper pattern may be formed of polyimide (PI), polyacrylate, polyacetate, or the like. Further, the second lower pattern and the second upper pattern may be formed of a silicone rubber such as polydimethylsiloxane (PDMS) or an elastomer such as polyurethane (PU) and polytetrafluoroethylene (PTFE).

<Driving element of non-active area>

The gate driver GD is a component which supplies a gate voltage to the plurality of pixels PX disposed in the active area AA. The gate driver GD includes a plurality of stages formed on the plurality of second plate patterns 123 and each stage of the gate driver GD may be electrically connected to each other by means of the plurality of gate connection lines. Accordingly, a gate voltage output from any one of stages may be transmitted to the other stage. Further, each stage may sequentially supply the gate voltage to the plurality of pixels PX connected to each stage.

The power supply PS is connected to the gate driver GD to supply a gate driving voltage and a gate clock voltage. The power supply PS is connected to the plurality of pixels PX to supply a pixel driving voltage to each of the plurality of pixels PX. Further, the power supply PS may also be formed on the plurality of second plate patterns 123. That is, the power supply PS may be formed to be adjacent to the gate driver GD on the second plate pattern 123. Further, power supplies PS formed on the plurality of second plate patterns 123 are electrically connected to the gate driver GD and the plurality of pixels PX. That is, the plurality of power supplies PS formed on the plurality of second plate patterns 123 may be connected by a gate power supply connection line and a pixel power supply connection line. Therefore, each of the plurality of power supplies PS supplies a gate driving voltage, a gate clock voltage, and a pixel driving voltage.

The printed circuit board PCB is a component which transmits signals and voltages for driving the display element from a control unit or controller to the display element. Therefore, the printed circuit board PCB may also be referred to as a driving substrate. The control unit such as an IC chip or a circuit unit may be mounted on the printed circuit board PCB. Further, on the printed circuit board PCB, a memory, a processor, or the like may also be mounted. Further, the printed circuit board PCB provided in the display device 100 may include a stretching area and a non-stretching area to ensure stretchability. Further, in the non-stretching area, an IC chip, a circuit unit, a memory, a processor, and the like are mounted and in the stretching area, wiring lines which are electrically connected to the IC chip, the circuit unit, the memory, and the processor may be disposed.

The data driver DD is a component which supplies a data voltage to the plurality of pixels PX disposed in the active area AA. The data driver DD is configured as an IC chip so that it is also referred to as a data integrated circuit D-IC. Further, the data driver DD may be mounted in the non-stretching area of the printed circuit board PCB. That is, the data driver DD may be mounted on the printed circuit board PCB in the form of a chip on board (COB). However, even though in FIG. 1, it is illustrated that the data driver DD is mounted in a chip on film (COF) manner, it is not limited thereto and the data driver DD may be mounted by a chip on board (COB), a chip on glass (COG), or a tape carrier package (TCP) manner.

Further, even though in FIG. 1, one data driver DD is disposed so as to correspond to one line of the first plate patterns 121 disposed in the active area AA, it is not limited thereto. That is, one data driver DD may be disposed so as to correspond to a plurality of lines of first plate patterns 121.

Hereinafter, the touch panel of the display device 100 according to the example embodiment of the present disclosure will be described in more detail with reference to FIG. 2 together.

<Plan view of touch panel>

Figure 2:
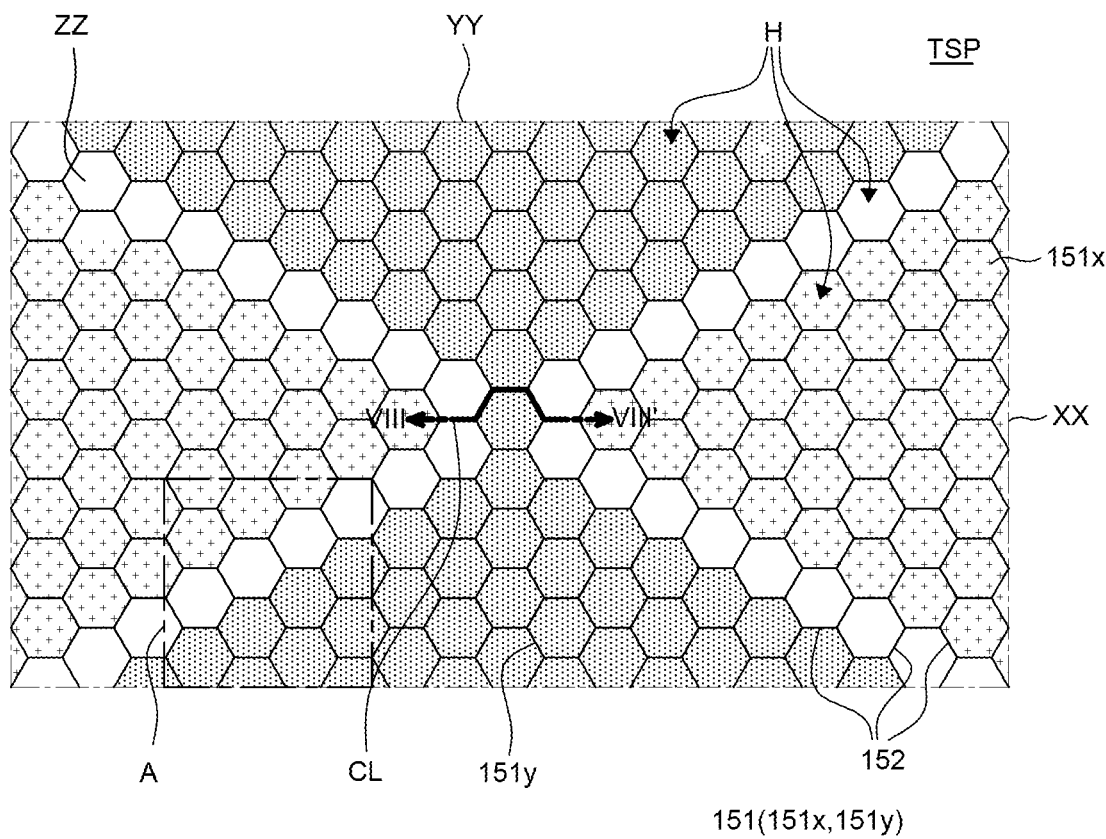
FIG. 2 is a plan view of a touch panel including a mesh pattern electrode of a display device according to an example embodiment of the present disclosure.

FIG. 2 is a plan view of a touch panel including a mesh pattern electrode according to an example embodiment of the present disclosure. FIG. 2 is a plan view simply illustrating only a placement type of a touch electrode 151 and an insulating layer 152 to explain a placement relationship of an insulating layer, a first touch electrode 151$x$, and a second touch electrode 151$y$. The touch panel TSP of the present disclosure may be configured to include an insulating layer 152, a touch electrode 151, and the like.

Referring to FIG. 2, it is illustrated that the first touch electrode 151$x$, the second touch electrode 151$y$, and the insulating layer 152 form a mesh type pattern.

The insulating layer 152 is patterned on the entire surface of the touch panel TSP with a mesh type to include a plurality of mesh patterns and a plurality of holes H. An area in which the insulating layer 152 is disposed may be divided into an area XX in which the first touch electrode 151$x$ is disposed, an area YY in which a second touch electrode 151$y$ is disposed on a lower surface of the insulating layer 152, and an area ZZ in which the touch electrode 151 is not disposed.

The insulating layer 152 is a substrate on which the touch electrode 151 is formed and may be formed of a plastic material having flexibility. For example, the insulating layer 152 may be formed of polyimide (PI), polyacrylate, polyacetate, or the like.

As illustrated in FIG. 2, the touch electrode 151 may be a mesh pattern electrode which is patterned with a mesh type to have two or more holes H. Specifically, the touch electrode 151 may be configured to have a hexagonal shape. However, it is not limited thereto and the touch electrode may have a polygonal shape such as a square shape or a rectangular shape. The plurality of mesh pattern electrodes may include a plurality of holes H.

The area XX in which the first touch electrode 151$x$ is disposed includes a plurality of first touch electrodes 151$x$ having a mesh pattern disposed so as to overlap the insulating layer 152 and a plurality of holes H. The area YY in which the second touch electrode 151$y$ is disposed includes a plurality of second touch electrodes 151$y$ with a mesh pattern disposed so as to overlap the insulating layer 152 and a plurality of holes H.

The touch electrode 151 is formed of a conductive metal line. The conductive metal line may use a metal line having a conductivity, and for example, may use molybdenum, titanium, gold, silver, palladium, platinum, aluminum, copper, nickel, tin, alloys and combinations thereof. Even though the touch electrode is illustrated as a single layer in the drawing, it may be formed as multi-layers on which a metal material layer is laminated. A line width of the conductive metal line may be 1 to 3 μm.

The touch electrode 151 is configured by a first touch electrode 151$x$ and a second touch electrode 151$y$ formed of a conductive material. The first touch electrode 151$x$ and the second touch electrode 151$y$ are disposed in different directions. The first touch electrode 151$x$ may be disposed in a first direction and the second touch electrode 151$y$ may be disposed in the second direction transverse the first direction. A touch driving signal is applied to the touch electrode 151 or a touch sensing signal is sensed by the touch electrode 151.

Hereinafter, the active area AA of the display device 100 according to the example embodiment of the present disclosure will be described in more detail with reference to FIGS. 3 to 5 together.

<Planar and cross-sectional structures of active area>

FIG. 3 is an enlarged plan view of an active area of a display panel according to an example embodiment of the present disclosure. FIG. 4 is an enlarged plan view of an active area of a display device according to an example embodiment of the present disclosure. FIG. 5 is a cross-sectional view taken along the line V-V' of FIG. 4.

Figure 4:
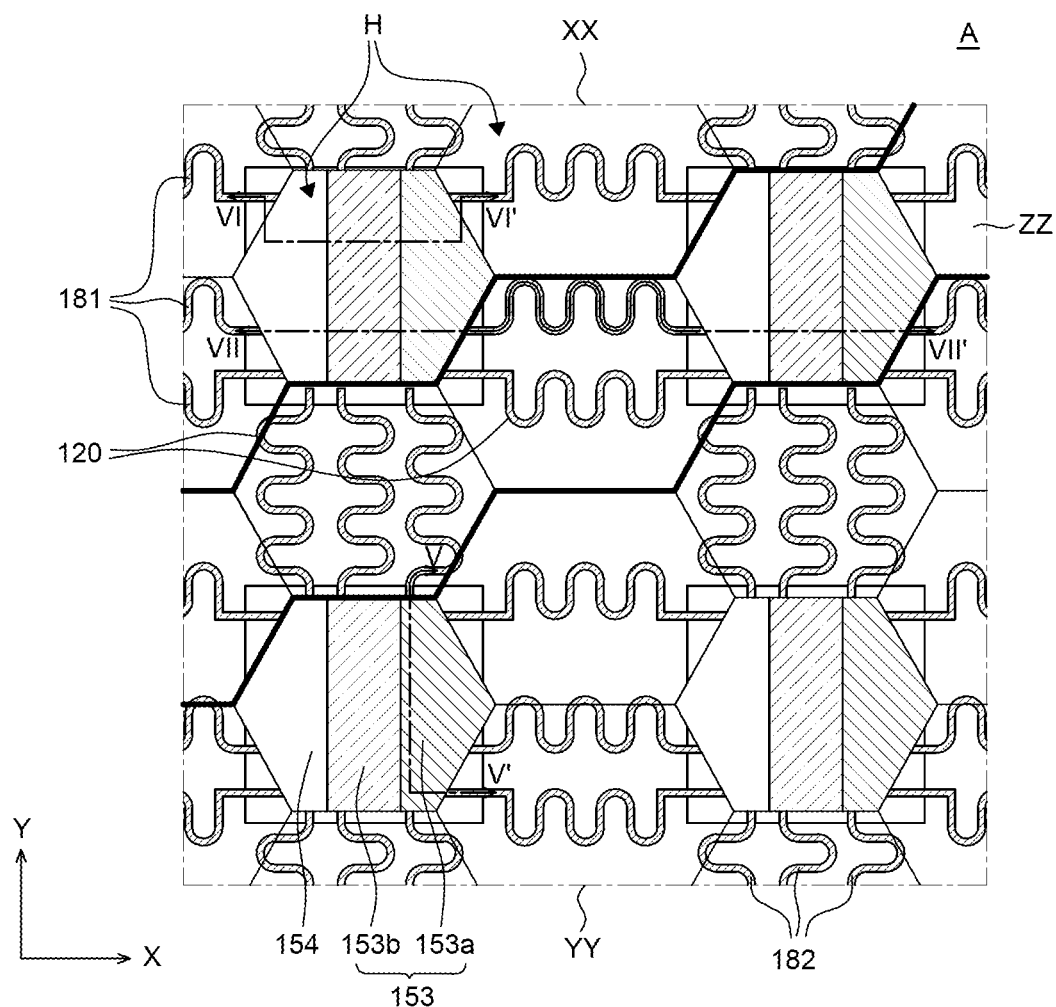
FIG. 4 is an enlarged plan view of an active area of a display device according to an example embodiment of the present disclosure.

Specifically, FIG. 3 is an enlarged plan view of the area A illustrated in FIG. 2, and FIG. 4 is an enlarged plan view of the area A illustrated in FIG. 2 when the touch panel TSP of FIG. 2 is disposed on the display panel PN of FIG. 1.

Referring to FIGS. 1 and 3 together, the plurality of first plate patterns 121 is disposed on the lower substrate 111 in the active area AA. The plurality of first plate patterns 121 is spaced apart from each other to be disposed on the lower substrate 111. For example, as illustrated in FIG. 1, the plurality of first plate patterns 121 may be disposed on the lower substrate 111 in a matrix, but is not limited thereto.

Referring to FIG. 3, a pixel PX including the plurality of sub pixels SPX is disposed in the first plate pattern 121. One pixel PX includes three sub pixels SP1, SP2, and SP3. For example, as illustrated in FIG. 3, the pixel PX may include a first sub pixel SP1, a second sub pixel SP2, and a third sub pixel SP3. Further, the first sub pixel SP1 is a red sub pixel, the second sub pixel SP2 is a blue sub pixel, and the third sub pixel SP3 is a green sub pixel. However, the present disclosure is not limited thereto and the plurality of sub pixels may be changed to various colors such as magenta, yellow, and cyan.

Each sub pixel SPX may include a light emitting diode 160 which is a display element and a transistor (not shown) which drives the light emitting diode 160. However, in the sub pixel SPX, the display element is not limited to an LED, and may also be changed to an organic light emitting diode.

The plurality of sub pixels SPX may be connected to a plurality of connection lines 181 and 182. That is, the plurality of sub pixels SPX may be electrically connected to a first connection line 181 extending in the first direction X. Further, the plurality of sub pixels SPX may be electrically connected to the second connection line 182 extending in the second direction Y.

A plurality of individual connection pads CP1 is disposed on the first plate pattern 121. The number of the plurality of individual connection pads CP1 disposed on one first plate pattern 121 may be equal to the number of the plurality of sub pixels SPX disposed on one first plate pattern 121. For example, as illustrated in FIG. 3, when three sub pixels SP1, SP2, and SP3 are disposed on one first plate pattern 121, three individual connection pads CP1 may be disposed on one first plate pattern 121.

The plurality of individual connection pads CP1 may be formed on the planarization layer 144 by the same process as the connection line 180. That is, the plurality of individual connection pads CP1 may be disposed on the same layer with the same material as the connection line 180, but is not limited thereto.

A common connection pad CP2 is disposed on the first plate pattern 121. The number of the common connection pad CP2 disposed on one first plate pattern 121 may be one, regardless of the number of the plurality of sub pixels SPX disposed on one first plate pattern 121. For example, as illustrated in FIG. 3, when three sub pixels SP1, SP2, and SP3 are disposed on one first plate pattern 121, the common connection pad CP2 needs to apply the same low potential power to three sub pixels SP1, SP2, and SP3 so that one common connection pad CP2 is disposed on one first plate pattern 121. Referring to FIG. 4, the touch panel TSP is disposed on the display panel PN and one mesh pattern electrode corresponds to one first plate pattern 121. In other words, the touch electrode 151 is configured by a plurality of mesh pattern electrodes and the plurality of mesh pattern electrodes includes a plurality of holes. Further, one of the plurality of holes H may correspond to one first plate pattern 121 among the plurality of first plate patterns 121. As illustrated in FIG. 4, one of four holes H may correspond to one first plate pattern 121.

In the hole H corresponding to one first plate pattern 121, a plurality of color conversion layers 153 and a light transmission layer 154 corresponding to each of the plurality of sub pixels SPX disposed in one first plate pattern 121. Further, an insulating layer 152 is disposed at edges of the plurality of color conversion layers 153 and the light transmission layer 154. The plurality of color conversion layers 153 may include a first color conversion layer 153a and a second color conversion layer 153b.

Referring to FIGS. 3 and 4 together, even though it is illustrated that the first color conversion layer 153a is disposed in the first sub pixel SP1, the second color conversion layer 153b is disposed in the second sub pixel SP2, and the light transmission layer 154 is disposed in the third sub pixel SP3, it is not limited thereto. The plurality of color conversion layers 153 and the light transmission layer 154 will be described below in more detail with reference to FIGS. 5 and 6.

Hereinafter, a cross-sectional structure of the active area AA will be described in detail with reference to FIG. 5. For the convenience of description of common characteristics of the plurality of sub pixels SPX, in FIG. 5, only a cross-sectional view of the first sub pixel SP1 is illustrated.

Figure 5:
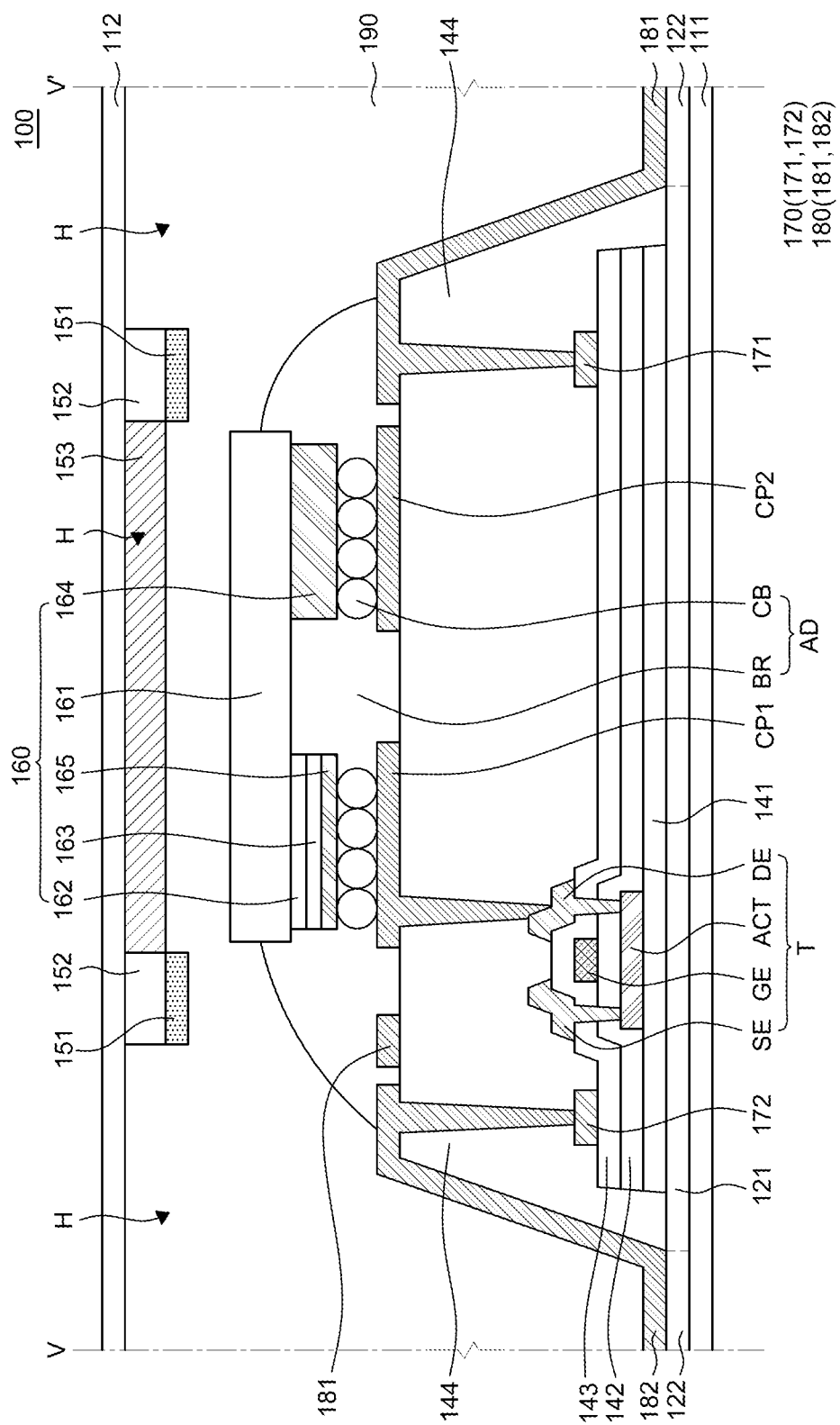
FIG. 5 is a cross-sectional view taken along the line V-V' of FIG. 4.

Referring to FIG. 5, a plurality of inorganic insulating layers is disposed on the plurality of first plate patterns 121. For example, the plurality of inorganic insulating layers may include a buffer layer 141, a gate insulating layer 142, and an interlayer insulating layer 143, but is not limited thereto. Therefore, various inorganic insulating layers may be additionally disposed on the plurality of first plate patterns 121 or one or more of the buffer layer 141, the gate insulating layer 142, and the interlayer insulating layer 143, which are the inorganic insulating layers, may be omitted.

Specifically, the buffer layer 141 is disposed on the plurality of first plate patterns 121. The buffer layer 141 is formed on the plurality of first plate patterns 121 to protect various components of the display device 100 from permeation of moisture ($H_2O$) and oxygen ($O_2$) from the outside of the lower substrate 111 and the plurality of first plate patterns 121. The buffer layer 141 may be configured by an insulating material. For example, the buffer layer 141 may be configured by a single layer or a double layer formed of at least one of silicon nitride (SiNx), silicon oxide (SiOx), and silicon oxynitride (SiON). However, the buffer layer 141 may be omitted depending on a structure or a characteristic of the display device 100.

At this time, the buffer layer 141 may be formed only in an area where the lower substrate 111 overlaps the plurality of first plate patterns 121 and the plurality of second plate patterns 123. As described above, the buffer layer 141 may be formed of an inorganic material so that the buffer layer 141 may be easily cracked or damaged during a process of stretching the display device 100. Therefore, the buffer layer 141 is not formed in an area between the plurality of first plate patterns 121 and the plurality of second plate patterns 123. Instead, the buffer layer 141 is patterned to have a shape of the plurality of first plate patterns 121 and the plurality of second plate patterns 123 to be disposed only above the plurality of first plate patterns 121 and the plurality of second plate patterns 123. Therefore, in the display device 100 according to the example embodiment of the present disclosure, the buffer layer 141 is formed only in an area overlapping the plurality of first plate patterns 121 and the plurality of second plate patterns 123 which are rigid patterns. Therefore, even though the display device 100 is bent or extended to be deformed, the damage of various components of the display device 100 may be suppressed.

Referring to FIG. 5, a transistor T including a gate electrode GE, an active layer ACT, a source electrode SE, and a drain electrode DE is formed on the buffer layer 141.

First, the active layer ACT is disposed on the buffer layer 141. For example, the active layer ACT may be formed of oxide semiconductor. For example, the active layer ACT may be formed of indium-gallium-zinc oxide, indium-gallium oxide, or indium-zinc oxide. Alternatively, the active layer ACT may be formed of amorphous silicon (a-Si), polycrystalline silicon (poly-Si), an organic semiconductor, or the like.

The gate insulating layer 142 is disposed on the active layer ACT. The gate insulating layer 142 is a layer for electrically insulating the gate electrode GE from the active layer ACT. Further, the gate insulating layer 142 may be formed of an insulating material. For example, the gate insulating layer 142 may be configured by a single layer of silicon nitride (SiNx) or silicon oxide (SiOx) which is an inorganic material or a multi-layer of silicon nitride (SiNx) or silicon oxide (SiOx), but it is not limited thereto.

The gate electrode GE is disposed on the gate insulating layer 142. Further, the gate electrode GE overlaps the active layer ACT.

The gate electrode GE may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

The interlayer insulating layer 143 is disposed on the gate electrode GE. The interlayer insulating layer 143 may be formed of an inorganic material, similar to the buffer layer 141. For example, the interlayer insulating layer 143 may be configured by a single layer of silicon nitride (SiNx) or silicon oxide (SiOx) which is an inorganic material or a multi-layer of silicon nitride (SiNx) or silicon oxide (SiOx), but it is not limited thereto.

The source electrode SE and the drain electrode DE of the transistor T are disposed on the interlayer insulating layer 143. The source electrode SE and the drain electrode DE of the transistor T are disposed on the same layer to be spaced apart from each other. Further, in the transistor T, the source electrode SE and the drain electrode DE may be in contact with the active layer ACT to be electrically connected to the active layer ACT.

The source electrode SE and the drain electrode DE may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

In FIG. 5, even though among various transistors which may be included in the display device 100, only a driving transistor is illustrated for the convenience of description, a switching transistor, a capacitor, or the like may also be included in the display device 100. Further, in this specification, even though it is described that the transistor T has a coplanar structure, various transistors such as a staggered structure may also be used. Further, in this specification, the transistor may be formed not only to have a top gate structure, but also to have a bottom gate structure.

A power pad 171 among the plurality of pads 170 is disposed on the interlayer insulating layer 143. The power pad 171 is a pad which transmits a power signal to the plurality of sub pixels SPX. The power signal may be transmitted from the power pad 171 to the pixel circuit via a wiring line formed on the first plate pattern 121. The power pad 171 may be formed of the same material as the source electrode SE and the drain electrode DE on the same layer, but is not limited thereto.

A data pad 172 among the plurality of pads 170 is disposed on the interlayer insulating layer 114. The data pad 172 is a pad which transmits a data signal to the plurality of sub pixels SPX. The data signal may be transmitted from the data pad 172 to the source electrode SE or the drain electrode DE via a data line formed on the first plate pattern 121. The data pad 172 may be formed of the same material as the source electrode SE and the drain electrode DE on the same layer, but is not limited thereto.

A planarization layer 144 is formed on the transistor T and the interlayer insulating layer 143. The planarization layer 144 planarizes an upper portion of the transistor T. The planarization layer 144 may be configured by a single layer or a plurality of layers and may be formed of an organic material. Therefore, the planarization layer 144 may also be referred to as an organic insulating layer. For example, the planarization layer 144 may be formed of an acrylic-based organic material, but is not limited thereto.

Referring to FIG. 5, the planarization layer 144 may be disposed so as to cover top surfaces and side surfaces of the buffer layer 141, the gate insulating layer 142, and the interlayer insulating layer 143 on the plurality of first plate patterns 121. Further, the planarization layer 144 encloses the buffer layer 141, the gate insulating layer 142, and the interlayer insulating layer 143 together with the plurality of first plate patterns 121. Specifically, the planarization layer 144 may be disposed so as to cover a top surface and a side surface of the interlayer insulating layer 143, a side surface of the gate insulating layer 142, a side surface of the buffer layer 141, and a part of a top surface of the plurality of first plate patterns 121. Therefore, the planarization layer 144 may compensate for a step at the side surfaces of the buffer layer 141, the gate insulating layer 142, and the interlayer insulating layer 143 and enhance an adhesive strength of the planarization layer 144 and the connection line 180 disposed on the side surface of the planarization layer 144.

An inclination angle of the side surface of the planarization layer 144 may be smaller than an inclination angle formed by side surfaces of the buffer layer 141, the gate insulating layer 142, and the interlayer insulating layer 143. For example, the side surface of the planarization layer 144 may have a slope which is gentler than a slope formed by a side surface of the interlayer insulating layer 143, a side surface of the gate insulating layer 142, and a side surface of the buffer layer 141. Therefore, the connection line 180 which is disposed to be in contact with the side surface of the planarization layer 144 is disposed with a gentle slope so that when the display device 100 is stretched, the stress generated in the connection line 181 may be reduced. Further, the side surface of the planarization layer 144 has a relatively gentle slope so that the crack of the connection line 180 or separation thereof from the side surface of the planarization layer 144 may be suppressed.

Referring to FIGS. 3 to 5, the connection line 180 refers to a wiring line which electrically connects the pads on the plurality of first plate patterns 121. The connection line 180 is disposed on the plurality of first line patterns 122. As described above, the connection line 180 disposed on the first line pattern 122 may also extend onto the plurality of first plate patterns 121 to be electrically connected to the power pad 171 and the data pad 172 on the plurality of first plate patterns 121. Further, referring to FIG. 1, the first line pattern 122 is not disposed in an area where the connection line 180 is not disposed, among areas between the plurality of first plate patterns 121.

The connection line 180 includes a first connection line 181 and a second connection line 182. The first connection line 181 and the second connection line 182 are disposed between the plurality of first plate patterns 121. Specifically, the first connection line 181 refers to a wiring line extending in the X-axis direction between the plurality of first plate patterns 121, among the connection lines 180. The second connection line 182 refers to a wiring line extending in the Y-axis direction between the plurality of first plate patterns 121, among the connection lines 180.

The connection lines 181 and 182 may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

In the case of a display panel of a general display device, various wiring lines such as a plurality of gate lines and a plurality of data lines extend between the plurality of sub pixels as a straight line to be disposed and the plurality of sub pixels is connected to one signal line. Therefore, in the display panel of the general display device, various wiring lines, such as a gate line, a data line, a high potential voltage line, a low potential voltage line, and a reference voltage line, extend from one side to the other side of the display panel of the organic light emitting display device without being disconnected on the substrate.

In contrast, in the display device 100 according to the example embodiment of the present disclosure, various wiring lines, such as a gate line, a data line, a high potential voltage line, a reference voltage line, or an initialization voltage line having a straight line shape which are considered to be used for the display panel of the general display device, is disposed on the plurality of first plate patterns 121 and the plurality of second plate patterns 123. That is, in the display device 100 according to the example embodiment of the present disclosure, a linear wiring line is disposed on the plurality of first plate patterns 121 and the plurality of second plate patterns 123.

In the display device 100 according to the example embodiment of the present disclosure, the pads on the two adjacent first plate patterns 121 may be connected by the connection lines 180. Accordingly, the connection lines 180 electrically connect the power pads 171 or the data pads 172 on two adjacent first plate patterns 121. Accordingly, the display device 100 according to the example embodiment of the present disclosure may include a plurality of connection lines 180 to electrically connect various wiring lines, such as a gate line, a data line, a high potential voltage line, a low potential voltage line, or a reference voltage line, between the plurality of first plate patterns 121.

In the meantime, referring to FIG. 5, an individual connection pad CP1 and a common connection pad CP2 are disposed on the planarization layer 144. The individual connection pad CP1 and the common connection pad CP2 are pads which transmit a signal to the plurality of light emitting diodes 160.

A plurality of individual connection pads CP1 is connected to the transistor T to transmit a voltage to the plurality of light emitting diodes 160. Therefore, the plurality of individual connection pads CP1 may serve as an anode.

The common connection pad CP2 is disposed on the planarization layer 144. The common connection pad CP2 is connected to the first connection line 181 to transmit a voltage to the plurality of light emitting diodes 160. Therefore, the plurality of individual connection pads CP1 may serve as a cathode.

When three light emitting diodes 160 are disposed on one first plate pattern 121, the common connection pad CP2 may apply the same low potential power to three light emitting diodes 160. Therefore, one common connection pad CP2 is disposed on one pixel substrate and one common connection pad CP2 and three light emitting diodes 160 may be electrically connected.

In the meantime, even though it is not illustrated in FIG. 5, a bank may be disposed on the individual connection pads CP1, the common connection pad CP2, the connection line 180, and the planarization layer 144. The bank serves to distinguish adjacent sub pixels SPX.

Referring to FIG. 5, the light emitting diode 160 is disposed on the individual connection pads CP1 and the common connection pad CP2. The light emitting diode 160 includes an n-type layer 161, an active layer 162, a p-type layer 163, an n-electrode 164, and a p-electrode 165. The light emitting diode 160 of the display device 100 according to the example embodiment of the present disclosure has a flip-chip structure in which the n-electrode 164 and the p-electrode 165 are formed on one surface and disposed below the active layer 162.

The n-type layer 161 may be formed by injecting an n-type impurity into gallium nitride (GaN) having excellent crystallinity. The n-type layer 161 may be disposed on a separate base substrate which is formed of a material which is capable of emitting light.

The active layer 162 is disposed on the n-type layer 161. The active layer 162 is a light emitting layer which emits light in the light emitting diode 160 and may be formed of a nitride semiconductor, for example, indium gallium nitride (InGaN). The p-type layer 163 is disposed on the active layer 162. The p-type layer 163 may be formed by injecting a p-type impurity into gallium nitride (GaN).

As described above, the light emitting diode 160 according to the example embodiment of the present disclosure may be manufactured by sequentially laminating the n-type layer 161, the active layer 162, and the p-type layer 163, and then etching a predetermined or selected part to form the n-electrode 164 and the p-electrode 165. In this case, the predetermined or selected part which is a space for separating the n-electrode 164 and the p-electrode 165 from each other may be etched to expose a part of the n-type layer 161. In other words, the surfaces of the light emitting diode 160 on which the n-electrode 164 and the p-electrode 165 are disposed are not flat surfaces, but have different heights.

As described above, in the etched area, in other words, on the n-type layer 161 exposed by the etching process, the n-electrode 164 is disposed. The n-electrode 164 may be formed of a conductive material. In the meantime, in an area which is not etched, in other words, on the p-type layer 163, the p-electrode 165 is disposed. The p-electrode 165 is also formed of a conductive material, and for example, may be formed of the same material as the n-electrode 164.

An adhesive layer AD is disposed on top surfaces of the individual connection pad CP1 and the common connection pad CP2 and between the individual connection pad CP1 and the common connection pad CP2 so that the light emitting diode 160 may be bonded onto the individual connection pad CP1 and the common connection pad CP2. In this case, the n-electrode 164 may be disposed on the common connection pad CP2 and the p-electrode 165 may be disposed on the individual connection pad CP1.

The adhesive layer AD may be a conductive adhesive layer in which conductive balls CB are dispersed in a base member BR. Therefore, when heat or a pressure is applied to the adhesive layer AD, the conductive balls CB are electrically connected in a portion applied with the heat or pressure to have a conductive property.

The conductive balls CB are mixed in the base member BR. When the electrode of the light emitting diode 160 and the common connection pad CP2 and the individual connection pads CP1 are bonded, the conductive balls may serve to electrically connect the electrode of the light emitting diode 160 and the common connection pad CP2 and the individual connection pads CP1. For example, the conductive balls CB may be configured of a conductive metal having a ductility, such as gold (Au), in a material such as nickel (Ni), but are not limited thereto. Further, a diameter of the conductive ball CB before being bonded may be approximately 4 µm, but is not limited thereto. When the electrode of the light emitting diode 160 and the connection pad are bonded, the material which encloses the internal conductive metal may be broken due to heat and pressure and the internal conductive metal is cooled to be hardened to electrically connect the electrode of the light emitting diode 160 and the connection pad.

The base member BR may be an adhesive member having adhesiveness and insulating property. For example, the base member BR may be a heat curable adhesive, but is not limited thereto.

Referring to FIG. 5, for example, the n-electrode 164 is electrically connected to the common connection pad CP2 by means of the adhesive layer AD and the p-electrode 165 is electrically connected to the individual connection pad CP1 by means of the adhesive layer AD. That is, after applying the adhesive layer AD in which the conductive balls CB are mixed on the individual connection pad CP1 and the common connection pad CP2 using an inkjet method, the light emitting diode 160 is transferred onto the adhesive layer AD and is pressurized and heated. By doing this, the individual connection pad CP1 is electrically connected to the p-electrode 165 and the common connection pad CP2 is electrically connected to the n-electrode 164, by means of the conductive balls CB. At this time, the conductive balls CB may be induced to be disposed only between the n-electrode 164 and the common connection pad CP2 and between the p-electrode 165 and the individual connection pad CP1. However, the remaining part of the adhesive layer AD excluding a part of the adhesive layer AD disposed between the n-electrode 164 and the common connection pad CP2 and a part of the adhesive layer AD disposed between the p-electrode 165 and the individual connection pad CP1 has an insulating property. In the meantime, the adhesive layer AD may be divided to be disposed on the individual connection pad CP1 and the common connection pad CP2, respectively.

As described above, the display device 100 according to the example embodiment of the present disclosure has a structure in which the light emitting diode 160 is disposed on the lower substrate 111 on which the transistor T is disposed. Therefore, when the display device 100 is turned on, different voltage levels which are applied to the individual connection pad CP1 and the common connection pad CP2 are transmitted to the n-electrode 164 and the p-electrode 165 so that the light emitting diode 160 emits light.

The upper substrate 112 is a substrate which supports various components disposed below the upper substrate 112. Specifically, the upper substrate 112 may be formed by coating and curing a material which configures the upper substrate 112 on the lower substrate 111 and the first plate pattern 121. The upper substrate 112 may be disposed to be in contact with the lower substrate 111, the first plate pattern 121, the first line pattern 122, and the connection lines 180.

The upper substrate 112 may be formed of the same material as the lower substrate 111. For example, the upper substrate 112 may be formed of a silicone rubber such as polydimethylsiloxane (PDMS) or an elastomer such as polyurethane (PU) and polytetrafluoroethylene (PTFE) and thus have a flexible property. However, the material of the upper substrate 112 is not limited thereto.

The color conversion layer 153 is disposed below the upper substrate 112. The color conversion layer 153 is a component which converts color light generated in the light emitting diode 160 into another color light. The color conversion layer 153 may be disposed to correspond to one light emitting diode 160. A side surface of the color conversion layer 153 is in contact with the insulating layer 152 and a lower surface of the color conversion layer 153 is in contact with the filling layer 190.

The insulating layer 152 is disposed below the upper substrate 112. The insulating layer 152 may be formed of the same material as the lower substrate and may be disposed at the edge of the color conversion layer 153.

In the meantime, even though not illustrated in FIG. 5, a polarization layer may be disposed on the upper substrate 112. The polarization layer may perform a function which polarizes light incident from the outside of the display device 100 to reduce the external light reflection. Further, an optical film other than the polarization layer may be disposed on the upper substrate 112.

Further, a filling layer 190 which is disposed on the entire surface of the display panel PN to bond the touch panel TSP and the display panel PN may be disposed. The filling layer 190 may include a curable adhesive. Specifically, the material which configures the filling layer 190 is coated on the entire surface of the lower substrate 111 and then is cured so that the filling layer 190 may be disposed between the components disposed on the upper substrate 112 and the lower substrate 111. For example, the filling layer 190 may be an optically clear adhesive (OCA) and may be configured by an acrylic-based adhesive, a silicon-based adhesive, a urethane-based adhesive, and the like. Hereinafter, the plurality of color conversion layers 153, the touch electrode 151, and the insulating layer 152 will be described in more detail with reference to FIGS. 6 to 8 together.

<Cross-sectional structures of touch electrode and color conversion layer>

Figure 6:
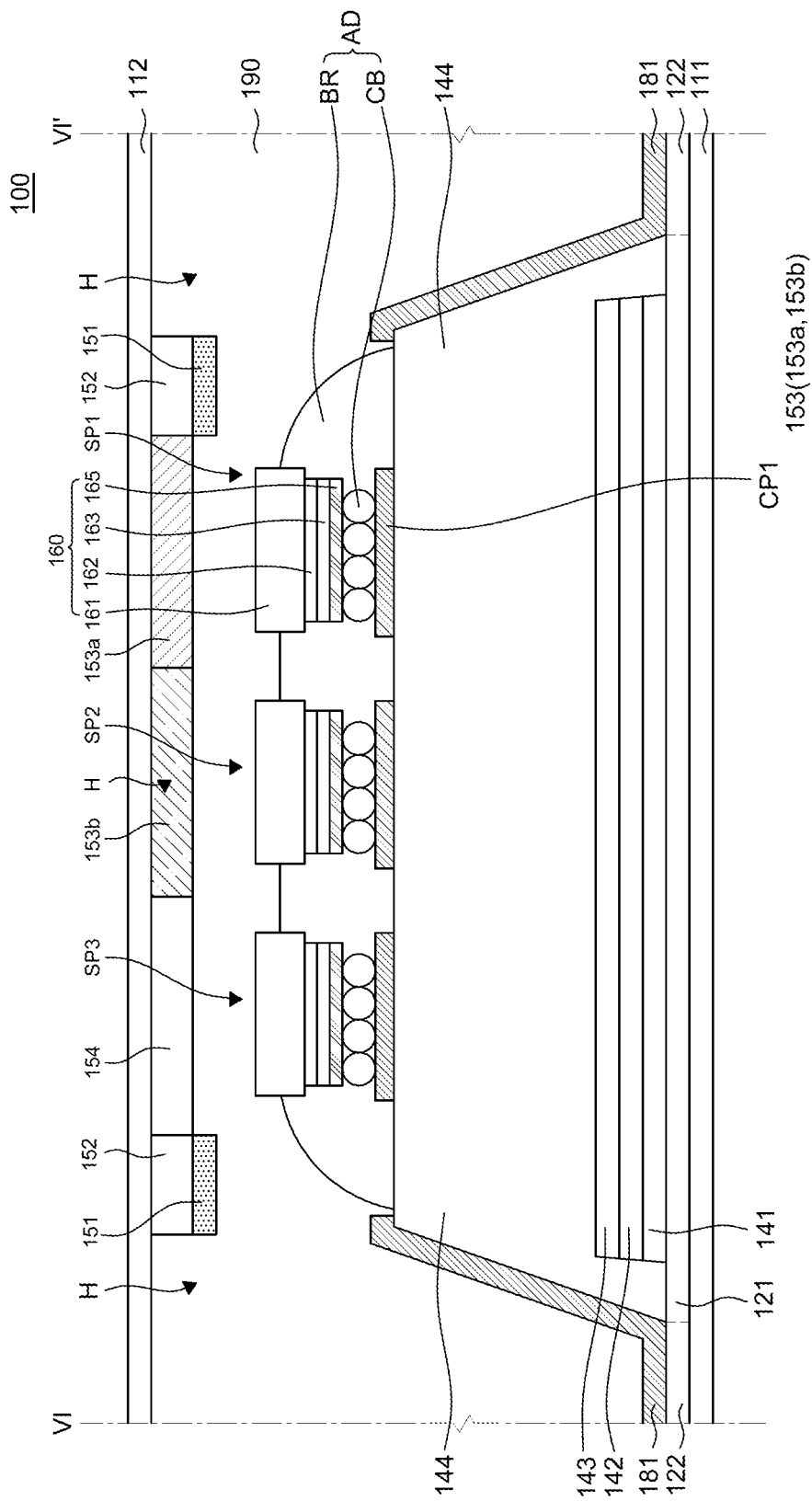
FIG. 6 is a cross-sectional view taken along the line VI-VI' of FIG. 4.
Figure 7:
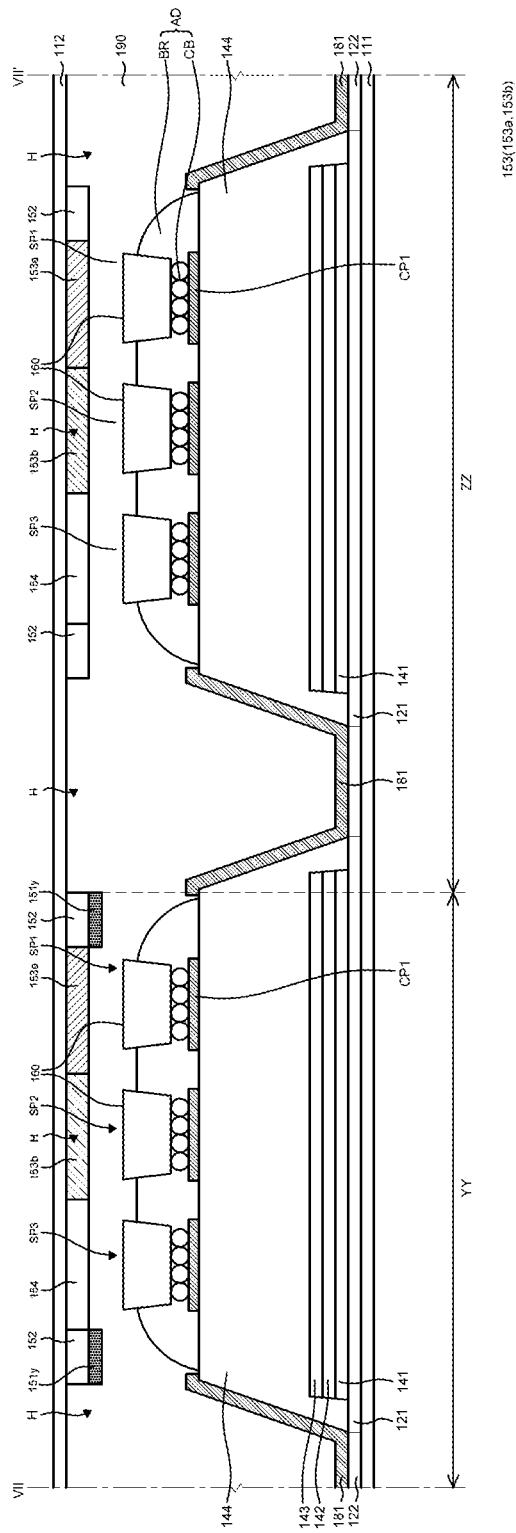
FIG. 7 is a cross-sectional view taken along the line VII-VII' of FIG. 4.
Figure 8:
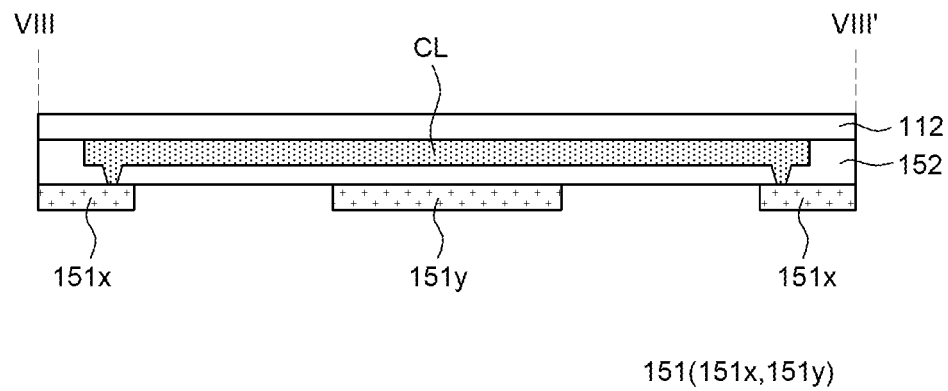
FIG. 8 is a cross-sectional view taken along the line VIII-VIII' of FIG. 2.

FIG. 6 is a cross-sectional view taken along the line VI-VI' of FIG. 4. FIG. 7 is a cross-sectional view taken along the line VII-VII' of FIG. 4. FIG. 8 is a cross-sectional view taken along the line VIII-VIII' of FIG. 2.

To be more specific, for the convenience of description, in FIG. 7, the light emitting diode 160 is briefly illustrated and in FIG. 8, only the upper substrate 112, the insulating layer 152, the touch electrode 151, and the connection electrode CL are illustrated.

Referring to FIG. 6, on the plurality of first plate patterns 121, the plurality of pixels PX is disposed, a plurality of light emitting diodes 160 corresponding to the plurality of pixels PX is disposed and a plurality of color conversion layers 153 corresponding to the plurality of light emitting diodes 160 is disposed.

The plurality of light emitting diodes 160 disposed on the plurality of pixels PX may be blue light emitting diodes.

The plurality of color conversion layers 153 includes a first color conversion layer 153a, a second color conversion layer 153b, and a light transmission layer 154. The first color conversion layer 153a converts blue light generated in the light emitting diode 160 into red light to emit the red light. That is, the first color conversion layer 153a may convert light having a wavelength of 400 nm or higher to 480 nm or lower into light having a wavelength of 600 nm or higher to 640 nm or lower.

The first color conversion layer 153a is disposed on the light emitting diode 160 in the first sub pixel SP1. Further, referring to FIGS. 4 and 6 together, a side surface of the first color conversion layer 153a may be in contact with a side surface of the insulating layer 152. Further, the red light may be emitted from the first sub pixel SP1 by the first color conversion layer 153a disposed in the first plate pattern 121.

The first color conversion layer 153a may include a filler and a first color conversion material dispersed in a filler. The filler may be formed of a transparent epoxy material which transmits light, but is not limited thereto.

The first color conversion material is mixed in the filler of the first color conversion layer 153a as a compound to be dispersed. The first color conversion material may accept third color light generated in the light emitting diode 160 to convert the third color light into first color light. Specifically, the first color conversion material accepts the blue light to convert the blue light into red light to emit the red light. That is, the blue light generated in the light emitting diode 160 may be incident onto the first color conversion layer 153a. The blue light incident onto the first color conversion layer 153a is converted into red light by the first color conversion material. The first color conversion layer 153a includes a first color conversion material to emit red light.

For example, the first color conversion material may be a material which generates light as electrons in an excited state descend from a conduction band to a valence band. Therefore, the first color conversion material converts light in a specific wavelength band into light in another wavelength band to be emitted.

The second color conversion layer 153b is disposed below the upper substrate 112. The second color conversion layer 153b is a component which converts blue light generated in the light emitting diode 160 into green light. That is, the second color conversion layer 153b may convert light having a wavelength of 400 nm or higher to 480 nm or lower into light having a wavelength of 520 nm or higher to 580 nm or lower. The second color conversion layer 153b is disposed on the light emitting diode 160 in the second sub pixel SP2. Further, the side surface of the first color conversion layer 153a may be in contact with the side surface of the insulating layer 152. The green light may be emitted from the second sub pixel SP2 by the second color conversion layer 153b disposed in the first plate pattern 121.

The second color conversion layer 153b may include a filler and a second color conversion material dispersed in a filler. The filler may be formed of the same material as the filler included in the first color conversion layer 153a. For example, the filler of the second color conversion layer 153b may be formed of a transparent epoxy material which transmits light, but is not limited thereto.

The light transmission layer 154 is disposed below the upper substrate 112. The light transmission layer 154 is a component which transmits blue light generated in the light emitting diode 160. The light transmission layer 154 is disposed on the light emitting diode 160 in the third sub pixel SP3. Further, the side surface of the light transmission layer 154 may be in contact with the side surface of the insulating layer 152.

The light transmission layer 154 may be formed of transparent resin and transmits light incident onto the light transmission layer 154 as it is. The light transmission layer 154 disposed on the first plate pattern 121 transmits blue light which is generated from the light emitting diode 160 to be incident onto the light transmission layer 154. Therefore, blue light may be emitted from the third sub pixel SP3. In various example embodiments, the light transmission layer 154 is not formed in a position corresponding to the third sub pixel SP3, but the display device may be configured to transmit blue light emitted from the third sub pixel SP3 as it is.

Referring to FIGS. 2 and 7 together, FIG. 7 is a cross-sectional view of an area YY in which a second touch electrode is disposed and an area ZZ adjacent thereto in which a touch electrode is not disposed. A plurality of color conversion layers 153 and the light transmission layer 154 which correspond to each of the plurality of light emitting diodes 160 are disposed above two adjacent first plate patterns 121 and the insulating layer 152 is disposed at the edge of the plurality of color conversion layers 153 and the light transmission layer 154. Here, a lower surface of the insulating layer 152 disposed on the first plate pattern 121 of the area YY in which the second touch electrode is disposed is in contact with the second touch electrode 151y. A lower surface of the insulating layer 152 disposed on the first plate pattern 121 of the area ZZ in which the touch electrode is not disposed may be in contact with the filling layer 190. That is, in some of the plurality of first plate patterns 121 in which the plurality of sub pixels SPX is disposed, only the insulating layer 152 with a mesh pattern may be disposed without the touch electrode 151.

Referring to FIGS. 2 and 8 together, the first touch electrode 151x and the second touch electrode 151y are disposed on the same plane. The first touch electrode 151x and the second touch electrode 151y are disposed on the lower surface of the insulating layer 152 and the connection electrode CL of the first touch electrode 151x is disposed on the upper surface of the insulating layer 152.

The first touch electrodes 151x may be disposed to be spaced apart from each other with a predetermined or selected interval along the first direction. Each of the plurality of first touch electrodes 151x may be electrically connected to another first touch electrode 151x adjacent thereto in the first direction by means of the connection electrode CL.

The second touch electrodes 151y are continuously disposed on the same plane. The connection line of the second touch electrode 151y is disposed in an area in which the connection electrode CL of the first touch electrode 151x is disposed. The connection line of the second touch electrode 151y is disposed on the same plane as the second touch electrode 151y to electrically connect the plurality of second touch electrodes 151y.

Even though not illustrated in the drawing, the first touch electrode 151x may be electrically connected to the touch driving circuit by means of a first touch routing line and a first touch pad. Similarly, the second touch electrode 151y may be electrically connected to the touch driving circuit by means of a second touch routing line and a second touch pad.

Referring to FIG. 8, each of the first touch electrode 151x and the second touch electrode 151y includes a plurality of touch blocks and the touch block of the second touch electrode 151y extends in the second direction Y on the same plane. Further, the connection line of the second touch electrode 151y is also disposed on the same plane as the touch block of the second touch electrode 151y. In the meantime, the touch block of the first touch electrode 151x is disposed in the first direction X, but the connection electrode CL which connects the adjacent touch blocks of the first touch electrode 151x may not be disposed on the same plane as the first touch electrode 151x. Specifically, the connection electrode CL of the first touch electrode 151x may be disposed so as to overlap the connection line of the second touch electrode 151y. The connection electrode CL of the first touch electrode 151x and the connection line of the second touch electrode 151y crossing each other may be disposed on different planes with an insulating layer 152 interposed therebetween. Therefore, the connection electrode CL of the first touch electrode 151x is disposed above the insulating layer 152 disposed on the upper surface of the first touch electrode 151x and the first touch electrode 151x is connected by means of the contact hole disposed in the insulating layer 152. If the connection electrode CL of the first touch electrode 151x and the connection line of the second touch electrode 151y cross each other on the same plane, the first touch electrode 151x and the second touch electrode 151y are electrically connected to each other and cannot sense the presence of a touch of a user or a touch position (touch coordinate).

Accordingly, the first touch electrode 151x and the second touch electrode 151y may be disposed on the same plane each other, but the connection electrode CL of the first touch electrode 151x may be disposed on different planes from the first touch electrode 151x and the second touch electrode 151y.

Accordingly, in the display device 100 according to the example embodiment of the present disclosure, a plurality of different color conversion layers 153 is disposed in the touch panel TSP above the plurality of light emitting diodes 160 which emits the same color light. Therefore, a process of separately bonding the color conversion layer 153 and the touch panel TSP is omitted and the color conversion layer 153 is also bonded by bonding the touch panel TSP above the display panel PN. Specifically, the plurality of color conversion layers 153 and the light transmission layer 154 are disposed in a hole H corresponding to the first plate pattern 121, among the plurality of holes H formed by patterning the insulating layer 152 to have a mesh type, so that the color conversion layer 153 is included in the touch panel TSP. Further, the color conversion layer 153 is provided so that the light emitting diode 160 may be transferred by only one transferring process of the plurality of light emitting diodes 160 which emits blue light without performing three transferring processes which transfers for each of the red, green, and blue light emitting diodes.

In the display device 100 according to the example embodiment of the present disclosure, the insulating layer 152 and the touch electrode 151 of the touch panel TSP are formed with a mesh pattern. Further, the holes H of the mesh pattern are disposed so as to correspond to the first plate pattern 121 so as not to block the plurality of pixels PX so that the reduction of transmittance by the insulating layer 152 and the touch electrode 151 may be suppressed. Further, the touch electrode 151 does not overlap the plurality of sub pixels SPX so that a touch electrode which is formed of a material having a less transmittance is also available so that a range of selecting a touch electrode material may be widened.

<Another example embodiment>

Figure 9:
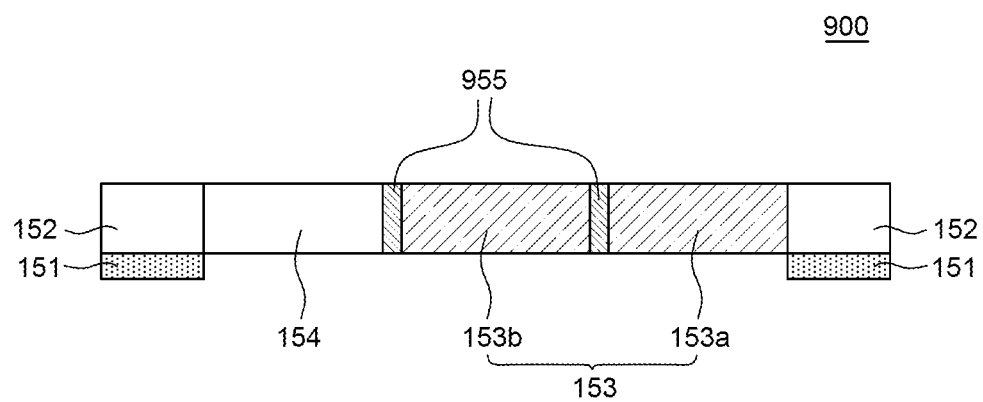
FIG. 9 is a cross-sectional view of a touch panel according to another example embodiment of the present disclosure.

FIG. 9 is a cross-sectional view of a touch panel according to another example embodiment of the present disclosure. Specifically, in FIG. 9, for the convenience of illustration, the display panel PN is omitted and only the insulating layer 152, the touch electrode 151, the color conversion layer 153, the light transmission layer 154, and a metal layer 955 which are components of the touch panel TSP are illustrated. As compared with the display device 100 of FIGS. 1 to 6, a display device 900 of FIG. 9 has the substantially same component except that the metal layer 955 of the touch panel TSP is included so that a redundant description will be omitted.

Referring to FIG. 9, the metal layer 955 is disposed between a plurality of color conversion layers 153 corresponding to the plurality of pixels PX and the light transmission layer 154. That is, the metal layers 955 may be disposed between the first color conversion layer 153a and the second color conversion layer 153b and between the second color conversion layer 153b and the light transmission layer 154. The metal layer 955 may partition areas in which the first color conversion layer 153a, the second color conversion layer 153b, and the light transmission layer 154 which are adjacent to each other are disposed.

Accordingly, in the display device 900 according to another example embodiment of the present disclosure, the color conversion layer 153 and the light transmission layer 154 are bonded above the display panel PN by bonding the touch panel TSP. Further, the metal layer 955 is disposed between the color conversion layer 153 and the light transmission layer 154 which are adjacent to each other to improve a light extraction efficiency by a light shielding and reflective film function. That is, light which is not transmitted to the color conversion layer 153 or the light transmission layer 154 corresponding to the light emitting diode 160 from the front is reflected by the metal layer 955 to reduce the reduction of an amount of light which is transmitted to the color conversion layer 153 and the light transmission layer 154. Therefore, the metal layer 955 improves the light extraction efficiency of the display device. Further, the transferring process of the plurality of light emitting diodes 160 may be reduced to one transferring process.

In the display device 900 according to another example embodiment of the present disclosure, the touch electrode 151 of the touch panel TSP is formed as a mesh pattern electrode. Further, the holes H of the mesh pattern electrode are disposed so as to correspond to the first plate pattern 121 so as not to block the plurality of pixels PX so that the reduction of transmittance by the touch electrode 151 may be suppressed.

Figure 10:
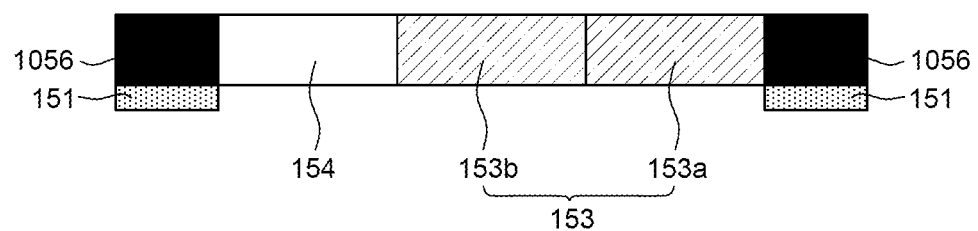
FIG. 10 is a cross-sectional view of a touch panel according to still another example embodiment of the present disclosure.

FIG. 10 is a cross-sectional view of a touch panel according to still another example embodiment of the present disclosure. Specifically, in FIG. 10, for the convenience of illustration, the display panel PN is omitted and only the touch electrode 151, the color conversion layer 153, the light transmission layer 154, and a black matrix 956 of the touch panel TSP are illustrated. As compared with the display device 100 of FIGS. 1 to 6, a display device 1000 of FIG. 10 has the substantially same component except that the black matrix 1056 is disposed instead of the insulating layer 152 of the touch panel TSP so that a redundant description will be omitted.

Referring to FIG. 10, the black matrix 1056 is disposed on side surfaces of the plurality of color conversion layers 153 and the light transmission layer 154 corresponding to the plurality of pixels PX and the light transmission layer 154 and the first touch electrode 151x and the second touch electrode 151y are disposed on a lower surface of the black matrix 1056. Accordingly, even though not illustrated in the drawing, the connection electrode CL may be disposed on an upper surface of the black matrix 1056. That is, the black matrix 1056 may be disposed in a part of a side surface of the first color conversion layer 153a, a part of a side surface of the second color conversion layer 153b, and a part of a side surface of the light transmission layer 154 which are in contact with an inner edge of the hole H of the mesh pattern electrode corresponding to the first plate pattern 121 of the touch electrode 151. The black matrix 1056 may partition the areas of the plurality of pixels PX or the plurality of first plate patterns 121.

Accordingly, in the display device 1000 according to still another example embodiment of the present disclosure, the color conversion layer 153 and the light transmission layer 154 are bonded above the display panel PN by bonding the touch panel TSP. Further, the black matrix 1056 is disposed on side surfaces of the color conversion layer 153 and the light transmission layer 154 and at an edge of the hole H of the mesh pattern electrode which is the touch electrode 151 to improve visibility and improve a light extraction efficiency.

In the display device 1000 according to still another example embodiment of the present disclosure, the touch electrode 151 of the touch panel TSP is formed as a mesh pattern electrode. Further, the holes H of the mesh pattern electrode are disposed so as to correspond to the first plate pattern 121 so as not to block the plurality of pixels PX so that the reduction of transmittance by the touch electrode 151 may be suppressed.

Figure 11:
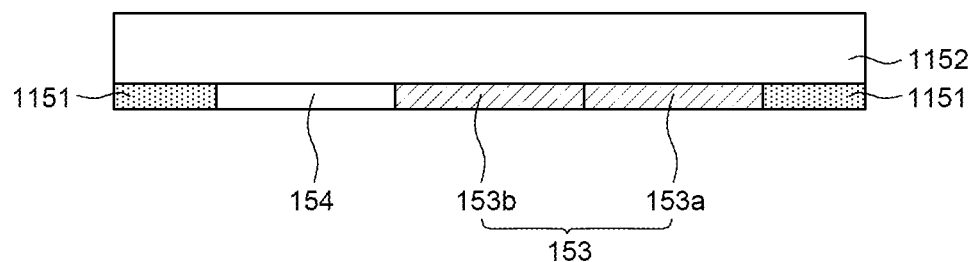
FIG. 11 is a cross-sectional view of a touch panel according to still another example embodiment of the present disclosure.

FIG. 11 is a cross-sectional view of a touch panel according to still another example embodiment of the present disclosure. Specifically, in FIG. 11, for the convenience of illustration, the display panel PN is omitted and only the touch electrode 151, the color conversion layer 153, the light transmission layer 154, and an insulating layer 1152 of the touch panel TSP are illustrated. As compared with the display device 100 of FIGS. 1 to 6, a display device 1100 of FIG. 11 has the substantially same component except for the insulating layer 1152 and the touch electrode 1151 of the touch panel TSP so that a redundant description will be omitted.

Referring to FIG. 11, the insulating layer 1152 is disposed between the plurality of color conversion layers 153 and the light transmission layer 154 and the upper substrate 112 and the touch electrode 1151 is disposed on side surfaces of the plurality of color conversion layers 153 and the light transmission layer 154. Accordingly, the connection electrode CL may be disposed between the upper substrate 112 and the insulating layer 1152. That is, the inner edge of the hole H of the mesh pattern electrode which is a touch electrode 1151 is in contact with the plurality of color conversion layers 153 and the light transmission layer 154. Further, the insulating layer 1152 does not form the mesh pattern, but may be disposed on the entire lower surface of the upper substrate 112.

Accordingly, in the touch panel TSP of the display device 1100 according to still another example embodiment of the present disclosure, the color conversion layer 153 and the light transmission layer 154 are disposed between the touch electrodes 1151. As a result, a display device in which the color conversion layer 153 is disposed without using a separate process of manufacturing and bonding a color conversion panel may be manufactured. Further, the touch electrode 1151 is disposed so as not to overlap the plurality of sub pixels SPX so that the reduction of the transmittance of the light emitting area by the touch electrode 1151 may be minimized.

The example embodiments of the present disclosure can also be described as follows:

According to an aspect of the present disclosure, there is provided a display device. The display device includes a display panel in which a plurality of pixels is disposed, a touch panel which is disposed on the display panel, and a filling layer is disposed between the display panel and the touch panel. The display panel includes: a stretchable lower substrate; a pattern layer which is disposed on the lower substrate and is configured by a plurality of plate patterns in which a plurality of pixels is disposed and a plurality of line patterns. Further, the touch panel includes: a stretchable upper substrate; a plurality of color conversion layers and a plurality of light transmission layers which are disposed on the upper substrate and correspond to the plurality of plate patterns; and a touch electrode which is disposed at an edge of the plurality color conversion layers and light transmission layers corresponding to each of the plurality of pixels among the plurality of color conversion layers and the plurality of light transmission layers.

The touch electrode may be formed by a first touch electrode or a second touch electrode overlapping in different directions and may further include a connection electrode which is disposed in a space between the first touch electrodes to connect the first touch electrode.

The display device may further include an insulating layer which is disposed on side surfaces of the plurality of color conversion layers and the light transmission layer corresponding to each of the plurality of pixels. The first touch electrode and the second touch electrode may be disposed on a lower surface of the insulating layer and the connection electrode may be disposed on an upper surface of the insulating layer.

The display device may further include a black matrix which is disposed on side surfaces of the plurality of color conversion layers and the light transmission layer corresponding to each of the plurality of pixels. The first touch electrode and the second touch electrode may be disposed on a lower surface of the black matrix, and the connection electrode may be disposed on an upper surface of the black matrix.

The display device may further include an insulating layer disposed between the upper substrate, the plurality of color conversion layers, and the light transmission layer. The first touch electrode and the second touch electrode may be disposed on side surfaces of the plurality of color conversion layers and the light transmission layer, and the connection electrode may be disposed between the upper substrate and the insulating layer.

The connection electrode may overlap an area in which the second touch electrode is disposed.

The touch electrode may be a plurality of mesh pattern electrodes.

The plurality of mesh pattern electrodes may include a plurality of holes, and one of the plurality of holes corresponds to one of the plurality of plate patterns.

The plurality of mesh pattern electrodes may have a hexagonal shape or a square shape.

The display device may further include a metal layer disposed between the plurality of color conversion layers and the light transmission layer corresponding to each of the plurality of pixels.

The display device may further include a plurality of blue light emitting diodes disposed in the plurality of pixels. The plurality of color conversion layers may be configured to convert a color of light emitted from the plurality of blue light emitting diodes.

The lower surface of the upper substrate may be opposite to the lower substrate.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure.

The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a display panel in which a plurality of pixels is disposed;
a touch panel which is disposed on the display panel; and
a filling layer that is disposed between the display panel and the touch panel,
wherein the display panel includes:
a stretchable lower substrate; and
a pattern layer which is disposed on the lower substrate and includes a plurality of plate patterns on which a plurality of pixels is disposed and a plurality of line patterns;
wherein the touch panel includes:
a stretchable upper substrate;
a plurality of color conversion layers and a plurality of light transmission layers which are disposed on the lower surface of the upper substrate and correspond to the plurality of plate patterns; and
a touch electrode which is disposed at an edge of respective color conversion layers and a respective light transmission layer corresponding to each of the plurality of pixels among the plurality of color conversion layers and the plurality of light transmission layers.

2. The display device according to claim 1, wherein the touch electrode is formed by a first touch electrode or a second touch electrode arranged in different directions from each other, and further includes a connection electrode which is disposed in a space between neighboring regions of the first touch electrodes to connect neighboring regions of the first touch electrode to each other.

3. The display device according to claim 2, further comprising:
an insulating layer which is disposed on side surfaces of the color conversion layers and the light transmission layer corresponding to each of the plurality of pixels,
wherein the first touch electrode and the second touch electrode are disposed on a lower surface of the insulating layer and the connection electrode is disposed on an upper surface of the insulating layer.

4. The display device according to claim 2, further comprising:
a black matrix which is disposed on side surfaces of the color conversion layers and the light transmission layer corresponding to each of the plurality of pixels,
wherein the first touch electrode and the second touch electrode are disposed on a lower surface of the black matrix, and the connection electrode is disposed on an upper surface of the black matrix.

5. The display device according to claim 2, further comprising:
an insulating layer disposed between the upper substrate, the color conversion layers, and the light transmission layer,
wherein the first touch electrode and the second touch electrode are disposed on side surfaces of the color conversion layers and the light transmission layer, and the connection electrode is disposed between the upper substrate and the insulating layer.

6. The display device according to claim 2, wherein the connection electrode overlaps an area in which the second touch electrode is disposed.

7. The display device according to claim 1, wherein the touch electrode is a plurality of mesh pattern electrodes.

8. The display device according to claim 7, wherein the plurality of mesh pattern electrodes includes a plurality of holes, and one of the plurality of holes corresponds to one of the plurality of plate patterns.

9. The display device according to claim 7, wherein the plurality of mesh pattern electrodes has a hexagonal shape or a square shape.

10. The display device according to claim 1, further comprising:
a metal layer disposed between the color conversion layers and the light transmission layer corresponding to each of the plurality of pixels.

11. The display device according to claim 1, further comprising:
a plurality of blue light emitting diodes disposed in the plurality of pixels,
wherein the plurality of color conversion layers is configured to convert a color of light emitted from the plurality of blue light emitting diodes.

12. The display device according to claim 1, wherein the lower surface of the upper substrate is opposite to the lower substrate.

* * * * *